United States Patent [19]

Nozawa

[11] Patent Number: 5,555,406
[45] Date of Patent: Sep. 10, 1996

[54] METHOD AND APPARATUS FOR ASSISTING THE DESIGN OF PARTS OF A PRODUCT

[75] Inventor: Takashi Nozawa, Susono, Japan

[73] Assignee: Toyota Jidosha Kabushiki Kaisha, Toyota, Japan

[21] Appl. No.: 298,012

[22] Filed: Aug. 30, 1994

[30] Foreign Application Priority Data

Aug. 30, 1993 [JP] Japan .................................... 5-214431
Jul. 22, 1994 [JP] Japan .................................... 6-171157

[51] Int. Cl.$^6$ .............................. G06G 7/64; G06F 15/00
[52] U.S. Cl. .............. 395/500; 364/468.03; 364/474.15; 364/474.16; 364/552; 364/512; 364/488; 395/919; 395/904; 395/11; 395/13
[58] Field of Search .................... 364/578, 148, 364/151, 152, 149, 178, 500, 468, 478, 403, 552, 401, 132, 488–491, 474.01, 474.02, 474.16, 474.24, 512, 551.01, 474.13, 474.15, 474.17, 469; 395/500, 10, 914, 65, 11, 62, 75, 904, 13, 21, 51, 921, 919

[56] References Cited

U.S. PATENT DOCUMENTS

| | | | |
|---|---|---|---|
| 4,591,983 | 5/1986 | Bennett et al. | 364/468 |
| 4,742,473 | 5/1988 | Shurgar et al. | 364/578 |
| 4,910,660 | 3/1990 | Li | 364/151 |
| 5,175,696 | 12/1992 | Hooper et al. | 395/921 |
| 5,200,908 | 4/1993 | Date et al. | 395/921 |
| 5,204,939 | 4/1993 | Yamazaki et al. | 395/921 |
| 5,208,765 | 5/1993 | Turnbull | 364/401 |
| 5,272,641 | 12/1993 | Ford et al. | 364/468 |
| 5,293,479 | 3/1994 | Quintero et al. | 395/921 |
| 5,311,438 | 5/1994 | Sellers et al. | 364/468 |
| 5,357,440 | 10/1994 | Talbott et al. | 395/919 |
| 5,394,509 | 2/1995 | Winston | 395/13 |
| 5,410,634 | 4/1995 | Li | 395/10 |
| 5,465,221 | 11/1995 | Merat et al. | 395/904 |

FOREIGN PATENT DOCUMENTS

| | | |
|---|---|---|
| 2126370 | 5/1990 | Japan . |
| 2126371 | 5/1990 | Japan . |
| 2128278 | 5/1990 | Japan . |
| 581062 | 4/1993 | Japan . |

Primary Examiner—Kevin J. Teska
Assistant Examiner—Jacques Louis-Jacques
Attorney, Agent, or Firm—Kenyon & Kenyon

[57] ABSTRACT

A design assisting apparatus for assisting the design of parts of a product comprised of an assembly of a plurality of parts. The design assisting apparatus is comprised of a plurality of part suitability examination devices and a product suitability examination device. Each part suitability examination device is comprised of a part performance decision device, a part knowledge data base for each input, and a part optimization device. The part optimization device optimizes the initially input parameters of a part by referring to the part knowledge stored in the corresponding part knowledge data base. The product suitability examination device comprises a product performance decision device, a product knowledge data base, and a product optimization device. The product optimization device optimizes the parameters of the parts constituting the product by referring to the product knowledge stored in the product knowledge data base. The parameters of the plurality of parts output by the part suitability examination device are optimized to satisfy the target performances for the product and then are output. Also, a method for the same.

4 Claims, 13 Drawing Sheets

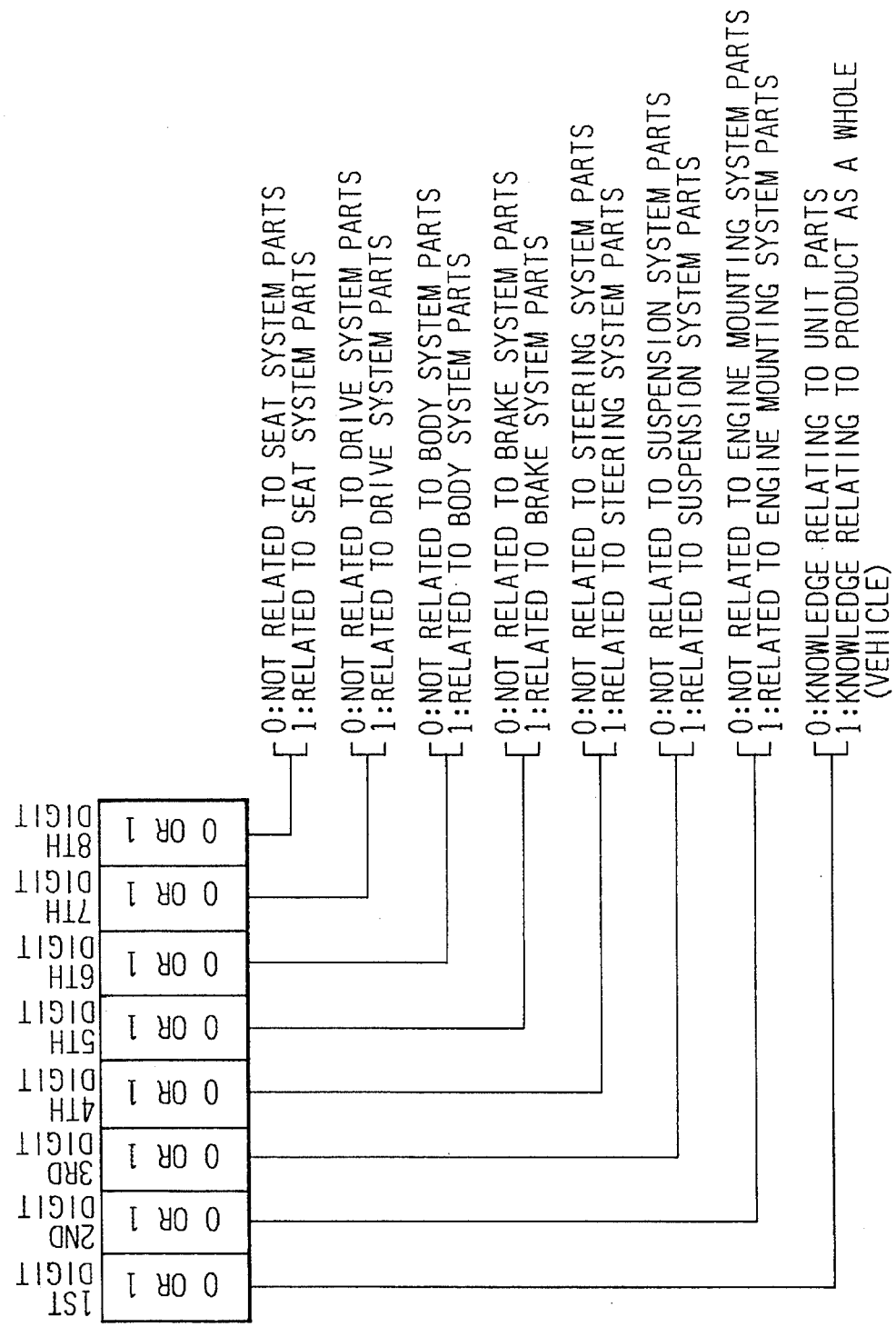

METHOD AND APPARATUS FOR ASSISTING THE DESIGN OF PARTS OF A PRODUCT

BACKGROUND OF THE INVENTION

1. Field of the Invention

The present invention relates to a method and apparatus for assisting design using a computer, more particularly relates to a method and apparatus for assisting the design of the individual parts of a product comprised of a large number of parts, such as an automobile.

2. Description of the Related Art

When making something, especially when making something by mass production, basically one draws up a design, fabricates a prototype based on that design, assesses if the prototype satisfies the required performances, feeds back the results to the design, modifies the design to overcome any problems, makes another prototype, and reassesses the same. This is repeated until the required performances are satisfied, then full-scale production is started using the design as the specifications satisfying the required performances.

Greater efficiency is being sought in these processes. For example, computer-aided design (CAD) is being introduced in the work of preparing the design drawings and computer simulation is being used to replace the steps of making the prototypes and assessment.

Whatever the case, a "good design" may be said to be a design which satisfies the required performances without repeated design modifications or with as little modifications as possible.

In particular, in the case where a product is comprised of a large number of parts and these have an effect on each other, it is necessary that the individual parts satisfy the basic performances as unit parts and that the product satisfy the overall performances of the product. There is therefore a high probability of repeated design modifications. To make a good design, it is particularly necessary therefore to efficiently design the product with due consideration to both the parts and product.

For a good design, it is necessary to store the valuable knowledge obtained through past experience and make effective use of the same.

However, this valuable knowledge is usually stored in the minds of individuals. There will therefore often be waste in the same design division with the same mistakes repeated and the same thing having to be redone.

Therefore, various attempts have been made to construct a system for storing knowledge using a computer and making use of the stored knowledge in accordance with need so as thereby to enable all designers to use the stored knowledge and therefore improve the efficiency of the design division as a whole.

Recently, design assisting apparatuses using so-called "expert systems" for using artificial intelligence (AI), comprised of a knowledge base storing expert knowledge and a reasoning mechanism, and applying the knowledge and performing reasoning in accordance with a problem have been developed in numerous fields.

For example, several design assisting apparatuses for the design work of automobiles have already been disclosed. For example, there are the design routine assisting apparatuses disclosed in Japanese Unexamined Patent Publication (Kokai) No. 2-126370, Japanese Unexamined Patent Publication (Kokai) No. 2-126371, and Japanese Unexamined Patent Publication (Kokai) No. 2-128278. In these apparatuses, a plurality of types of knowledge on routines required for a design are stored combined and arranged in a hierarchical structure.

Further, in the apparatus disclosed in Japanese Unexamined Patent Publication (Kokai) No. 5-81062, there are disclosed a step of checking the normality of the individual unit parts and a step of judging the normality of the product as a whole when combining these parts.

In constructing a design assisting system using a computer, however, the important thing is that the system be easy to use by the user, that is, the designer, and that not too much time be taken for the reasoning and judgement in the computer.

For this purpose, the system must match with the characteristics of the design work for the product to be designed.

Accordingly, when considering a design assisting system for automobile parts, it is necessary to examine the characteristics of the design work for auto parts.

When taking the example of auto parts and considering the characteristics of their design work, the first thing which should be noted is that automobiles are comprised of an extremely large number of parts and that these are all complicatedly related with each other.

When considering the design of individual parts, however, in so far as the individual parts are objects with self-complete shapes, what are affected are certain characteristics of other parts and what give an effect are certain characteristics of those parts, i.e., there is no mutual effect with all the parameters of other parts.

If one can determine the types and characteristics of other parts which are affected, the types and characteristics of other parts which give an effect, and what items of the final product are affected, then one can proceed independently with the design of the different parts. If not, then unless the detailed specifications of a large component, for example, an engine, having an effect on a large number of other parts are all determined, no progress can be made in the design of the large number of parts affected by the engine.

That is, it is not necessary to consider the effects from elsewhere and the effects on other locations at all times in the detailed sections of the design work of parts.

In a design assisting system using a large data base where everything is connected together, knowledge not required for the design of a part will be considered and time will be wasted in the reasoning or the system will become hard to handle and in the end will tend to not be effectively utilized.

The apparatuses disclosed in Japanese Unexamined Patent Publication (Kokai) No. 2-126370, Japanese Unexamined Patent Publication (Kokai) No. 2-126371, and Japanese Unexamined Patent Publication (Kokai) No. 2-128278, however, are complicated ones using data bases storing the knowledge on the plurality of routines necessary for design combined and arranged in a hierarchical structure. Various improvements have been made to reduce this complexity, but from the way the basic data bases are constructed, there is a tendency for time to be taken in the reasoning and searching.

Further, even in the apparatus disclosed in Japanese Unexamined Patent Publication (Kokai) No. 5-81062, the same knowledge data base is used for judging the normality of the individual unit parts and the normality of the product as a whole, so when the amount of knowledge becomes huge, time is taken for searching. When parts designed with reference to knowledge covering the product as a whole as well are combined, a need arises for redesigning the parts when assembling the product.

SUMMARY OF THE INVENTION

The present invention, in consideration of the above problems, has as its object the provision of a design assisting apparatus and method enabling quick performance of the work for finding the parameters of the individual parts of a product comprised of a plurality of parts so as to satisfy the performances of the unit parts and also satisfy the performances of the product.

To achieve the above object, according to a first aspect of the present invention, there is provided a design assisting apparatus for assisting the design of parts of a product comprised of an assembly of a plurality of parts, the design assisting apparatus being comprised of a group of means for examining the suitability of parts, comprised of a plurality of part examination means, and a product suitability examination means, the part suitability examination means each being comprised of a part performance decision means for deciding if the target performances for a part are satisfied, a part knowledge data base storing knowledge for enabling each of the plurality of parts to satisfy the target performance of the part, and a part optimization means for optimizing the parameters of a part by refering to the part knowledge stored in the corresponding part data bases so that the part satisfies the target performances for the part in the case where the part does not satisfy the target performances for the part, the initially input parameters being optimized to satisfy the target performances and then output, the product suitability examination means comprising a product performance decision means for deciding if the product satisfies the target performances for the product, a product knowledge data base storing the knowledge for enabling the product to satisfy the target performances for the product, and a product optimization means for optimizing the parameters of the plurality of parts constituting the product by refering to the product knowledge stored in the product data base so that the product satisfies the target performances for the product in the case where the product does not satisfy the target performances for the product, the parameters of the plurality of parts output by the part suitability examination means being optimized to satisfy the target performances for the product and then output.

Preferably, the target performances which the part performance decision means each use as indicators for their decisions are basic part performances, the knowledge stored in the part knowledge data bases is knowledge for enabling each of the plurality of parts to satisfy the basic part performances, the target performances which the product performance decision means uses as an indicator for its decisions are the overall product performances, the knowledge stored in the product knowledge data base is knowledge for enabling the product to satisfy the overall product performances of the product, the part suitability examination means optimizing and outputting the parameters initially input for each of the plurality of parts by refering to the part knowledge to stored in the corresponding part knowledge data bases so as to satisfy the basic part performances in the case where the part does not satisfy the basic part performance for the part, and the product suitability examination means optimizing and outputting the parameters of the plurality of parts output by the part suitability examinations means by referring to the product knowledge stored in the product knowledge data bases so as to satisfy the overall product performances of the product in the case where the product does not satisfy the overall product performance for the product.

Further, according to a second aspect of the present invention, there is provided a method for assisting the design of parts of a product comprised of a plurality of parts, the method for assisting design comprising deciding if each of the plurality of parts satisfies the target performances for that part, optimizing and outputting the initially input parameters of the part by referring to knowledge for enabling each of the plurality of parts to satisfy the target performances of the part stored in a corresponding part knowledge data base so that each of the plurality of parts satisfies the target performance for that part, in the case where each of the plurality of parts does not satisfy the target performances for that part, deciding if the product comprised of the assembly of the plurality of parts with the parameters optimized to satisfy the target performances of the parts satisfies the target performances for the product, and optimizing and outputting the parameters of the plurality of parts, optimized to satisfy the target performances of the parts by referring to the knowledge for enabling the product to satisfy the target performances of the product stored in a product knowledge data base so as to satisfy the performances of the product in the case where the product does not satisfy the performances for the product.

Preferably, the target performances which are used as indicators for decision are basic part performances, the knowledge stored in the part knowledge data bases is knowledge for enabling each of the plurality of parts to satisfy the basic part performances of the parts, the target performances which are used as indicators for decision are overall performances, the knowledge stored in the product knowledge data bases is knowledge for enabling the product to satisfy the overall performances of the product, the optimizing and outputting of the initially input parameters of the parts are performed by referring to knowledge for enabling each of the plurality of parts to satisfy the basic part performances stored in the corresponding part data bases so that each of the plurality of the parts satisfies the basic part performance of the part in the case where the part does not satisfy the basic part performance of the part, and the optimizing and outputting of the parameters of the parts optimized to satisfy the basic part performances are performed by referring to the knowledge for enabling the product to satisfy the overall performances of the product stored in the product data base so that the product satisfies the overall product performance for the product in the case where the product does not satisfy the overall product performance of the product.

BRIEF DESCRIPTION OF THE DRAWINGS

These and other objects and features of the present invention will become clearer from the following description of preferred embodiments made with reference to the appended drawings, in which:

FIG. 13 is a view of examples of classification information prepared in the processing operation shown in FIG. 12.

DESCRIPTION OF THE PREFERRED EMBODIMENTS

An explanation will now be made of details of the present invention with reference to the appended drawings.

Figure 1:
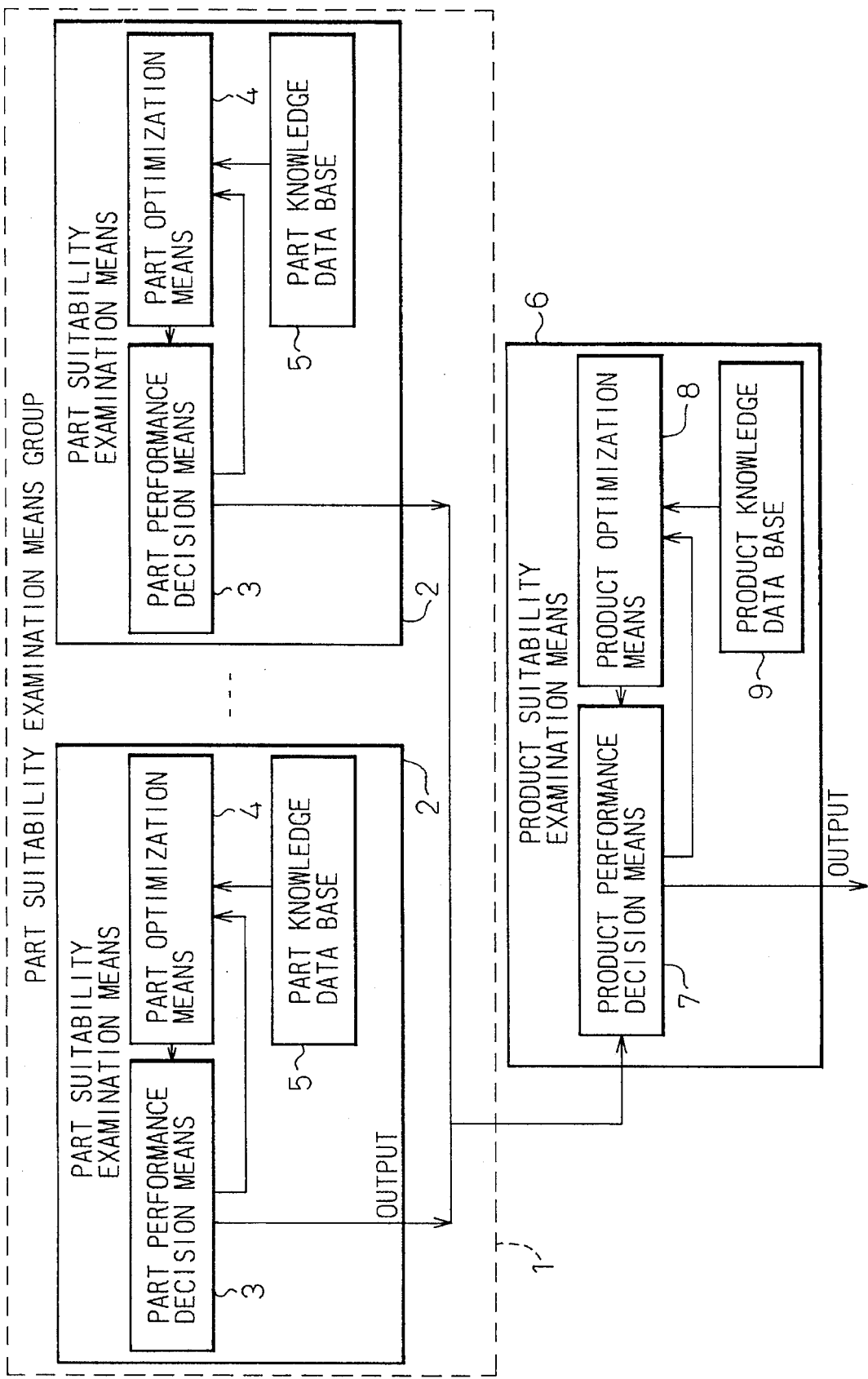
FIG. 1 is a view of the configuration of a design assisting apparatus according to the present invention.

FIG. 1 is a view showing the configuration of the design assisting system according to the present invention, wherein 1 is a part suitability examination means group comprised of a plurality of part suitability examination means 2 corresponding to the parts constituting the product. Each part suitability examination means 2 is comprised of an individual part performance decision means 3, an individual part optimization means 4, and an individual part knowledge data base 5. An individual part performance decision means 3 decides based on the parameters initially input through an input unit (not shown) if the performances of the individual part are satisfied. If satisfied, the parameters are output as they are, while if not satisfied, the individual part optimization means 4 is proceeded to where optimization is performed referring to the knowledge stored in the individual part knowledge data base 5. The individual part performance decision means 3 is returned to again, where, if the performances of the individual part are satisfied, the parameters are output.

In the part knowledge data base 5, the means for satisfying the performances of the individual parts, the allowable range of modification of parameters, etc. are stored expressed by general use AI software, that is, Prolog or Lisp.

Reference numeral 6 is a product suitability examination means, which is comprised of a product performance decision means 7, a product optimization means 8, and a product knowledge data base 9 and receives as input the parameters output from the part suitability examination means 2 through an input unit (not shown).

The product performance decision means 7 decides based on the parameters if the performances of the product are satisfactory. If satisfactory, it outputs the parameters as they are, while if not satisfactory, it goes to the product optimization means 8, where the parameters are optimized with reference to the knowledge stored in the product knowledge data base 9. The product performance decision means 7 is then returned to, where the parameters are output if the performances of the product are satisfied.

In the product knowledge data base 9, the means for satisfying the performances of the product, the allowable range of modification of parameters, etc. are stored expressed by general use AI software, that is, Prolog or Lisp, in the same way as in the individual part knowledge data bases 5.

Below, an explanation will be given of the operational processing in the design assisting apparatus constituted in this way taking as an example the design of an automobile part.

Figure 2:
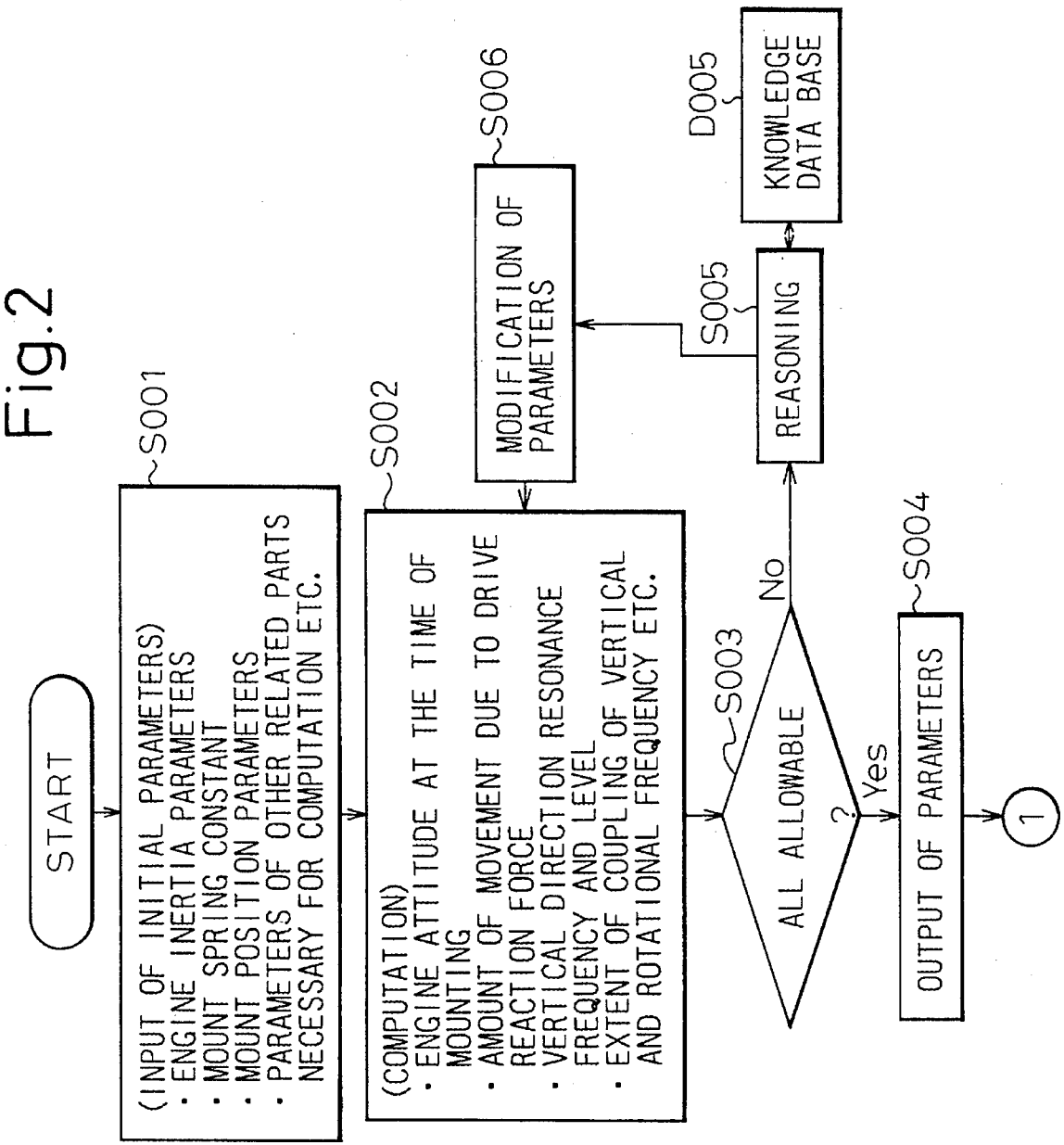
FIG. 2 is a flow chart of a processing operation of a part suitability examination means of a first embodiment of the design assisting apparatus according to the present invention (engine mounting system parts)
Figure 3:
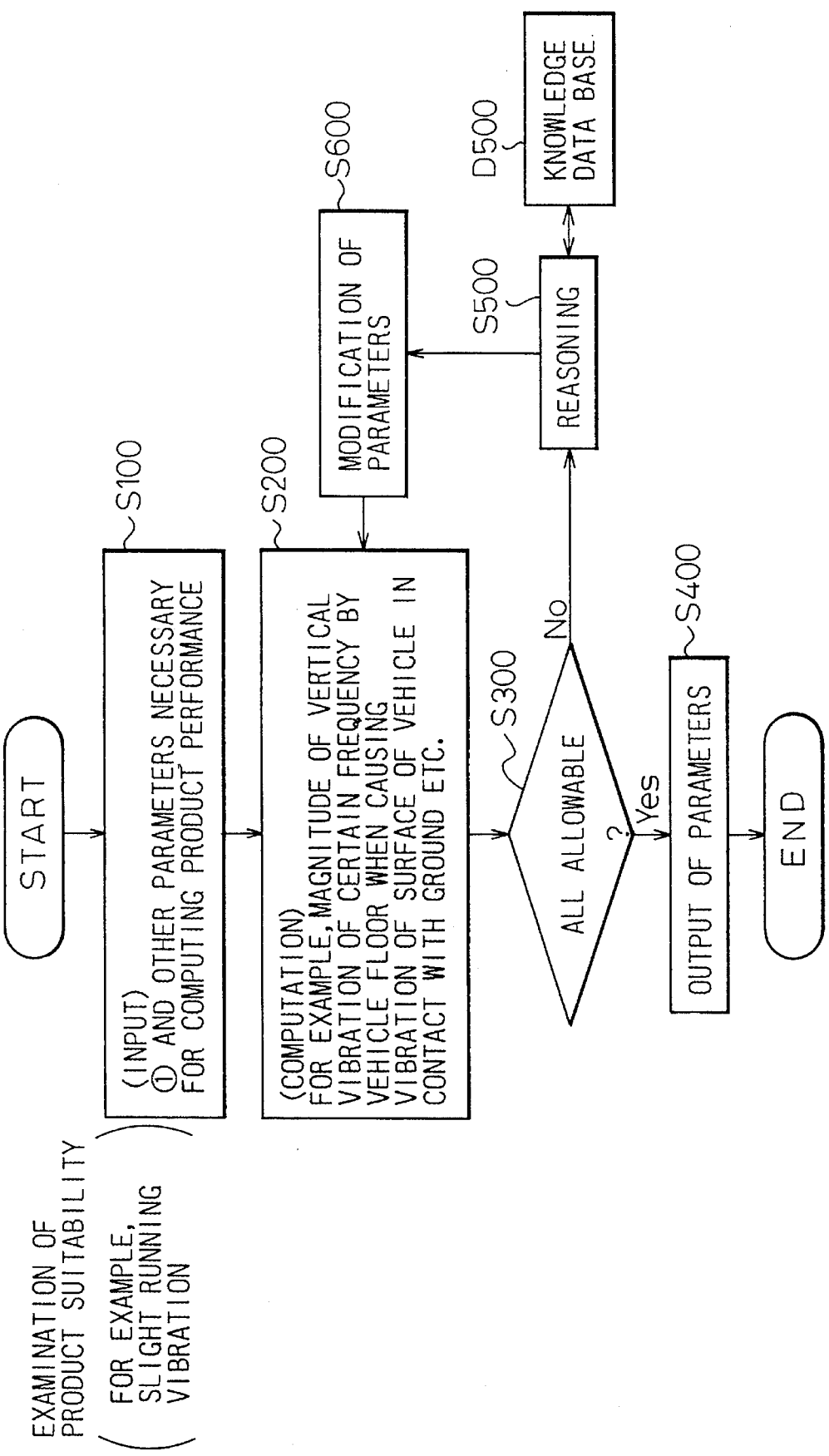
FIG. 3 is a flow chart of a processing operation of a product suitability examination means of the first embodiment of the design assisting apparatus according to the present invention.

FIG. 2 and FIG. 3 are flow charts of a first embodiment of a design assisting apparatus of the present invention, which show the case of work using a design assisting apparatus according to claim 1 of the present invention in the design of one part of an automobile, that is, an engine mounting system.

First, FIG. 2 shows the processing routine of the part suitability examination means. In the first embodiment, the targets of the engine mounting system are that the capability of supporting the engine and the capability of absorbing the drive reaction force be at a suitable level and also that the vibration of the engine mounting system be at a suitable level.

At step 001, the mount position of the engine mounting system, the spring constant, the engine inertia and parameters of other related parts which are necessary to perform the computations at step 002 are input as the initial parameters.

At step 002, the engine attitude at the time of mounting is computed as an indicator of supportability of the engine, the amount of movement due to the drive reaction force as an indicator of the absorbability of the drive reaction force and the vertical direction resonance frequency and level of and the extent of coupling of the vertical vibration and rotational vibration as indicators of absorbability of vibration.

At step 003, it is decided if the results of the computation at step 002 clear the allowable values. If yes, that is, if they clear the allowable values, the routine proceeds to step 004, where they are output. Conversely, if no, that is, if they exceed the allowable values, the routine proceeds to step 005.

At step 005, the knowledge stored in the individual part knowledge data bases D005 is referred to and reasoning is performed to determine what to do so that the results of computation at step 002 will be determined to clear the allowable values at step 003.

Accordingly, the individual part knowledge data base D005 has stored in it the methods for making the engine attitude at the time of mounting, the amount of movement due to the drive reaction force, the mainly vertical direction resonance frequency and vibration level, the degree of coupling of the vertical vibration and rotational vibration, etc. clear the allowable values, the range of modification of the parameters, etc.

For example, an instruction is given to modify the parameters so as to strengthen the degree of coupling of the vertical vibration and rotational vibration if the mainly vertical direction resonance frequency $f_z$ is smaller than a certain value and the vibration level at $f_z$ is above the target value and, conversely, to weaken the degree of coupling if the mainly vertical direction resonance frequency $f_z$ is larger than a certain value. Further, for the modification of the parameters, the limits of modification, extent of modifications, direction of modifications, etc. are specifically instructed.

At step 006, the parameters are modified based on the results of the reasoning at step 005, the routine returns to step 002, computation is performed again, and the routine proceeds to step 003. If it decided that the allowable values are cleared, the routine proceeds to step 004, where the values are output. If it is decided at step 003 that the allowable values are exceeded, the routine once again proceeds to step 005. This is repeated until the decision at step 003 becomes yes.

Next, the parameters of the engine mounting system decided on in this way are input to the product suitability examination means for examining the performances of the product, that is, the automobile. For a product like an automobile, it is necessary to check on a large number of performance features. Even to check one of the performance features among them, for example, the vehicle vibration performance, since there are a large number of related parts, the parameters of a large number of parts are input through a similar process in addition to the parameters of the engine mounting system.

FIG. 3 shows a processing routine of the product suitability examination means.

It shows a process of optimizing the parameters of an engine mounting system to prevent the slight vibration caused during driving, called the "slight running vibration" here, from being transmitted to the driver and passengers.

The slight running vibration is just one example of points to be examined by the product suitability examination means. Many other points are also examined.

At step 100, the parameters output at step 004 are input. Here, what are input are not only the parameters of the engine mounting system, but all the parameters required for examining the vibration characteristics of the product.

At step 200, as an example, a certain frequency vertical vibration of the floor of the vehicle when vibration is applied to the ground contact surface of the vehicle is computed.

At step 300, it is determined if the result of computation at step 200 clears the allowable value. If yes, the routine proceeds to step 400, where it is output and the routine ended, while if no, the routine proceeds to step 500.

At step 500, the knowledge stored in the product knowledge data base D500 is referred to and what to do so that the result of computation at step 200 will decide that the value has cleared the allowable value at step 300 is reasoned. Accordingly, the method of enabling the magnitude of the certain frequency vertical vibration of the floor of the vehicle at the time of application of vibration to the ground contact surface of the vehicle to clear the allowable value is stored in the product knowledge data base D500.

At step 600, the parameters are modified based on the result of the reasoning at step 500, the routine returns to step 200, computation is performed again, and the routine proceeds to step 300. If it is determined that the allowable value is cleared, the routine proceeds to step 400 where the parameters are output. If it is determined that the value exceeds the allowable value at step 300, the routine once again proceeds to step 500. This is repeated until the decision at step 300 is yes.

In this way, according to the first embodiment of the present invention, the parameters of one of the parts of the product comprised of a plurality of parts, that is, the engine mounting system of an automobile, are optimized by the part suitability examination means so that the capability of supporting the engine, the capability of absorbing the drive reaction force, and the vibration of the engine mounting system become suitable in level and then are optimized by the product suitability examination means so that the slight running vibration of the automobile is not transmitted to the driver and passengers.

Next, an explanation will be made of a second embodiment of the present invention. The second embodiment of the present invention is of the case of performing the design work using the design assisting apparatus according to claim 2 of the present invention. As compared with the first embodiment, the target performances of the unit parts are limited to the basic part performances able to be decided on at the level of the individual parts themselves. Below, in the same way as the explanation of the first embodiment, an explanation will be made taking as an example an automobile. The following are the main parts comprising an automobile and the basic part performances which are able to be examined at the level of the parts themselves:

(1) Engine mounting system: supportability of engine, absorbability of drive reaction force (2) Suspension system (including tires): driving stability (3) Steering system: turning performance (4) Braking system: braking performance (5) Body: styling, body rigidity, collision performance (6) Drive system: acceleration/deceleration performance (7) Seat system: sitting comfort and holding property Here, note should be taken that in the second embodiment, the basic performances to be satisfied by the unit parts of the engine mounting system are limited to the points which are able to be examined at the level of the engine mount system parts themselves, for example, the engine supportability and the absorbability of the drive reaction force. The absorbability of vibration of the engine mounting system which had been included in the first embodiment is excluded here.

On the other hand, in the product performance decision means of the product suitability examination means, a decision is made on the overall performances of the vehicle as a product. When it is decided that the overall performances of the vehicle are not satisfied, knowledge for satisfying them is stored in the product knowledge data base. Here, the overall vehicle performances mean the items which require assessment for the vehicle, involve a plurality of parts, and cannot be assessed at the level of the unit parts. For example, it means the following items, each of which involves the plurality of parts listed under them:

(V-1): IDLING VIBRATION

[Phenomenon: Vibration occurring when vehicle is stopped and engine is idling]
[Related parts: Engine mounting system, suspension system (including tires), steering system, body]

(V-2): SLIGHT RUNNING VIBRATION

[Phenomenon: Slight vibration occurring during driving]
[Related parts: Engine mounting system, suspension system (including tires), seat system]

(V-3): LOW FREQUENCY RIDING COMFORT

[Phenomenon: Low frequency and large amplitude vibration occurring during driving]
[Related parts: Suspension system (including tires), seat system]

(V-4): BODY SHAKING

[Phenomenon: Violent vibration in vertical or lateral direction of body]
[Related parts: Suspension system (including tires), body]

(V-5): ACCELERATION/DECELERATION SHOCK

[Phenomenon: Shock occurring at time of gear change in automatic transmission car or when sudden torque acts from engine at the timing of rapid acceleration or gear change]
[Related parts: Suspension system (including tires), seat system]

(V-6): HARSHNESS

[Phenomenon: Sporadic, shock-like vibration occurring when vehicle passes over seam, level difference, etc. of road surface]
[Related parts: Engine mounting system, suspension system (including tires)]

(V-7): ENGINE SHAKING

[Phenomenon: Violent vibration of engine in vertical or lateral direction]
[Related parts: Engine mounting system, suspension system (including tires)]

(V-8): BRAKING VIBRATION

[Phenomenon: Vibration occurring when brake is applied]
[Related parts: Suspension system (including tires), braking system]

(N-1): ENGINE NOISE

[Phenomenon: Noise radiated from engine and propagated through air or solids to enter into cabin]
[Related parts: Engine mounting system]

(N-2): ROAD NOISE

[Phenomenon: Cabin noise occurring while driving over rough road surfaces]
[Related parts: Suspension system (including tires), seat system]

(N-3): HARSHNESS NOISE

[Phenomenon: Sporadic, shock-like noise occurring when vehicle passes over seam, level difference, etc. of road surface]
[Related parts: Suspension system (including tires)]

(N-4): BRAKING NOISE

[Phenomenon: Noise occurring due to friction at time of operation of brakes]
[Related parts: Suspension system (including tires), braking system]

(N-5): GEAR NOISE

[Phenomenon: Noise occurring from transmission or differential gears]
[Related parts: Body, drive system]

(C-1): STABILITY & CONTROLLABILITY

[Phenomenon: Ease of operation when actively operating the steering wheel and the response to the same and stability when not actively operating the steering wheel]
[Related parts: Engine mounting system, steering system, body]

Figure 4:
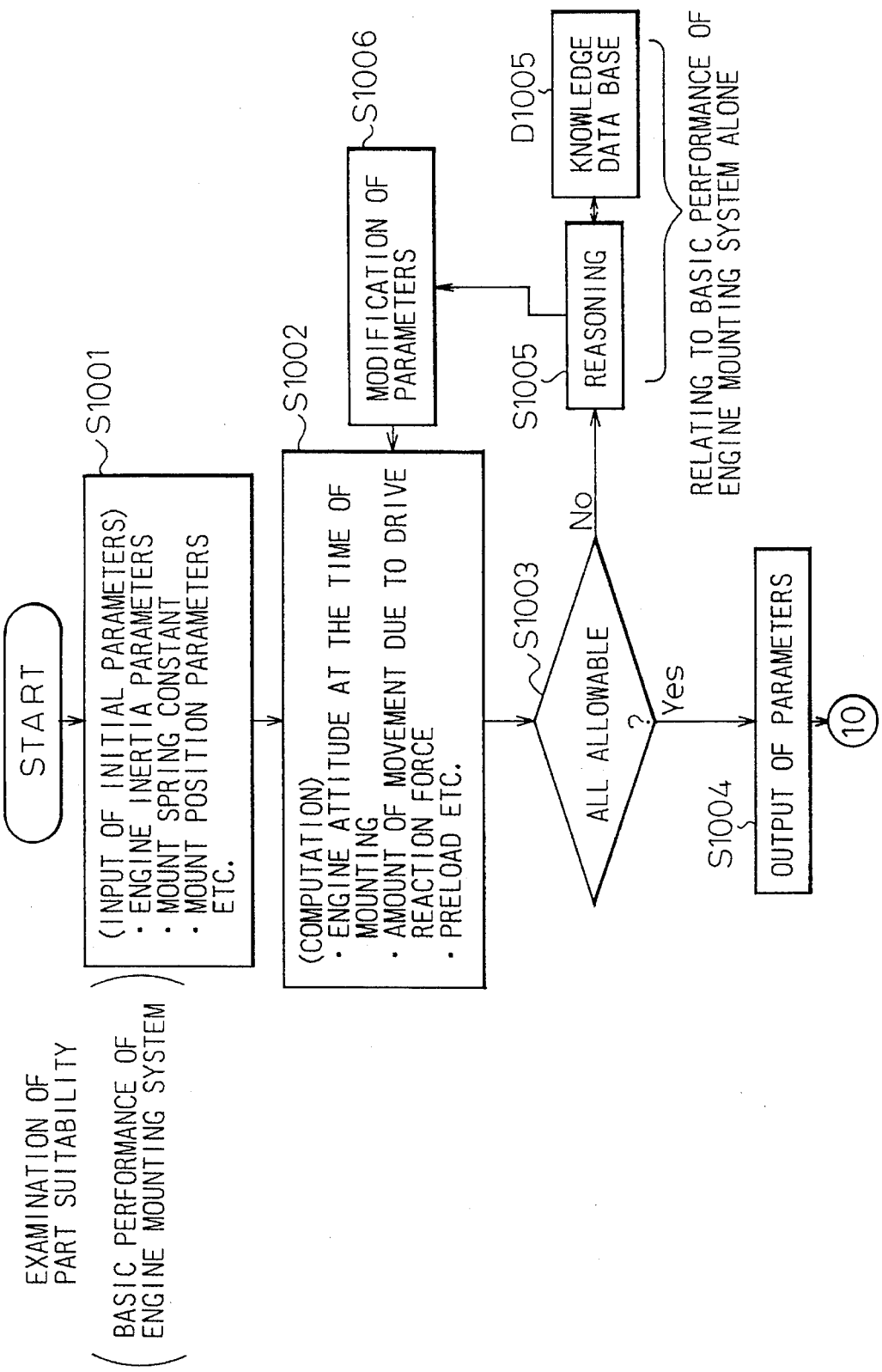
FIG. 4 is a flow chart of a processing operation of a part suitability examination means of a second embodiment of the design assisting apparatus according to the present invention (engine mounting system parts)

FIG. 4 is a flow chart of the processing routine of the part suitability examination means of the engine mounting system parts. Basically, the flow is the same as that shown in FIG. 2, so details will be omitted, but the items input at step 1001 do not include the parameters of related parts as in the items input at step 001 of FIG. 2. Further, the items computed at step 1002 do not include the items of the vertical direction resonance frequency and level or the extent of coupling of the vertical and rotational frequency requiring the parameters of other related parts as compared with the items computed at step 002 of FIG. 2.

Figure 5:
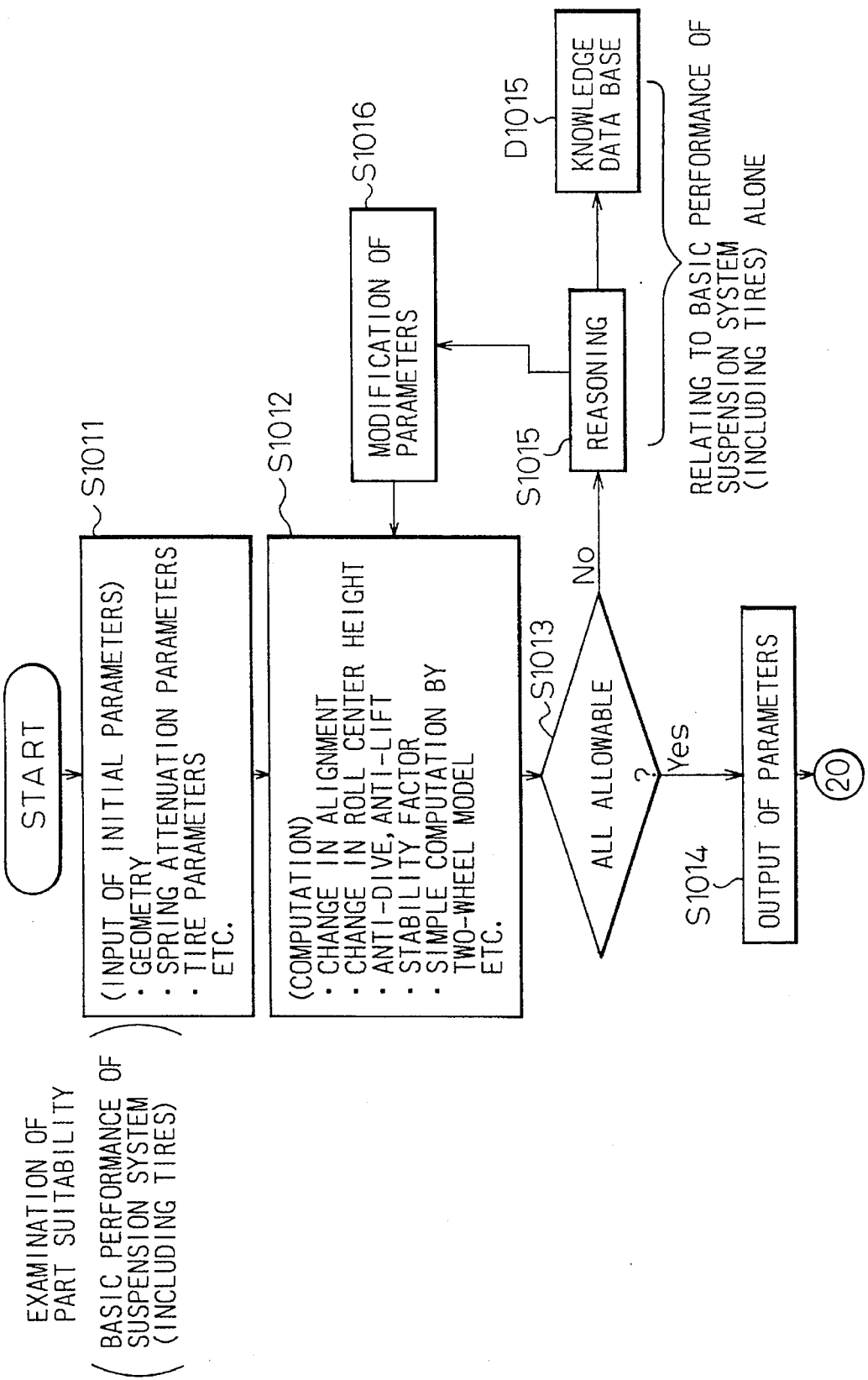
FIG. 5 is a flow chart of a processing operation of a part suitability examination means of the second embodiment of the design assisting apparatus according to the present invention (suspension system parts)

In the same way, FIG. 5 is a flow chart of a processing operation of a part suitability examination means of suspension system parts.

Figure 6:
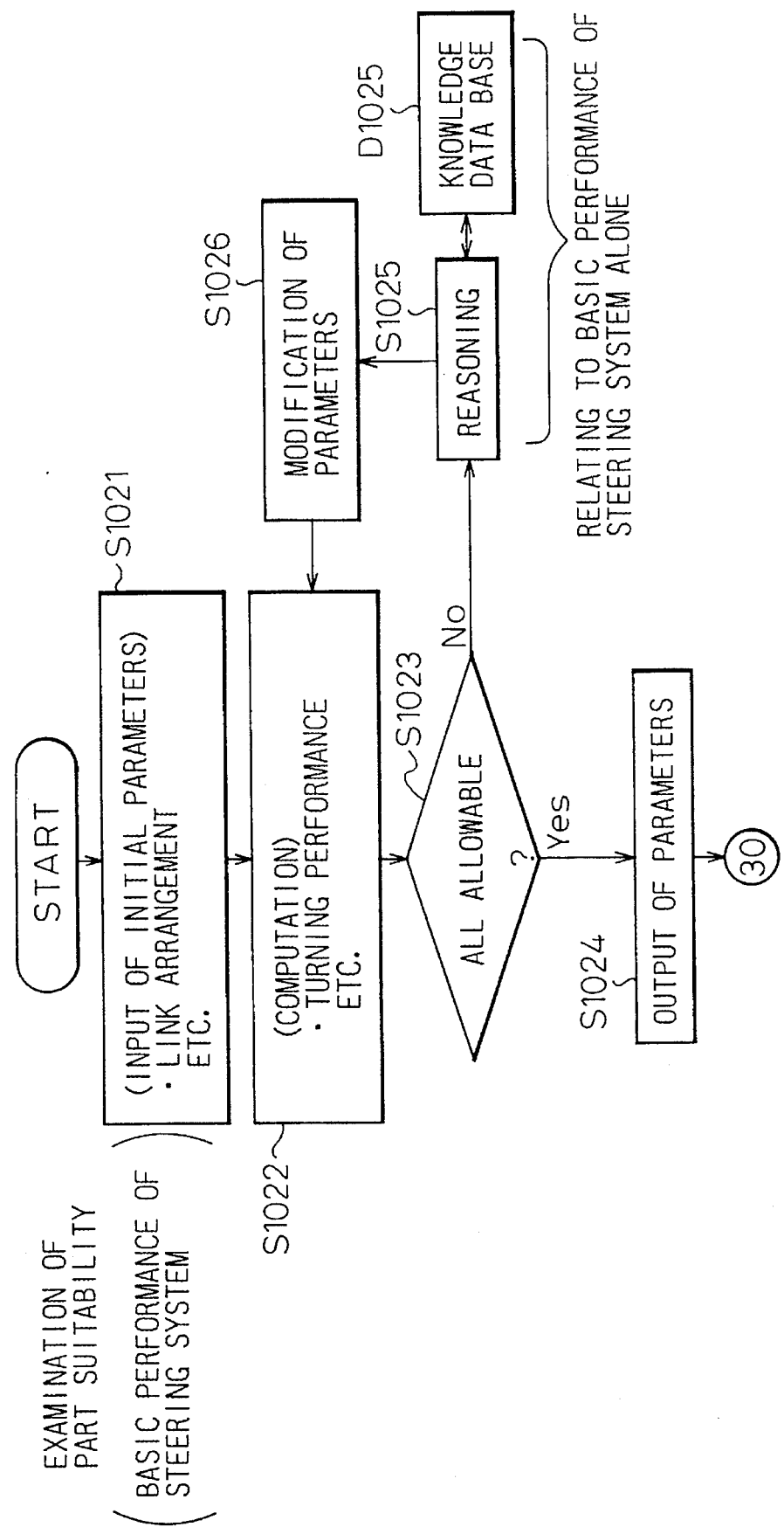
FIG. 6 is a flow chart of a processing operation of a part suitability examination means of the second embodiment of the design assisting apparatus according to the present invention (steering system parts)

In the same way, FIG. 6 is a flow chart of a processing operation of a part suitability examination means of steering system parts.

Figure 7:
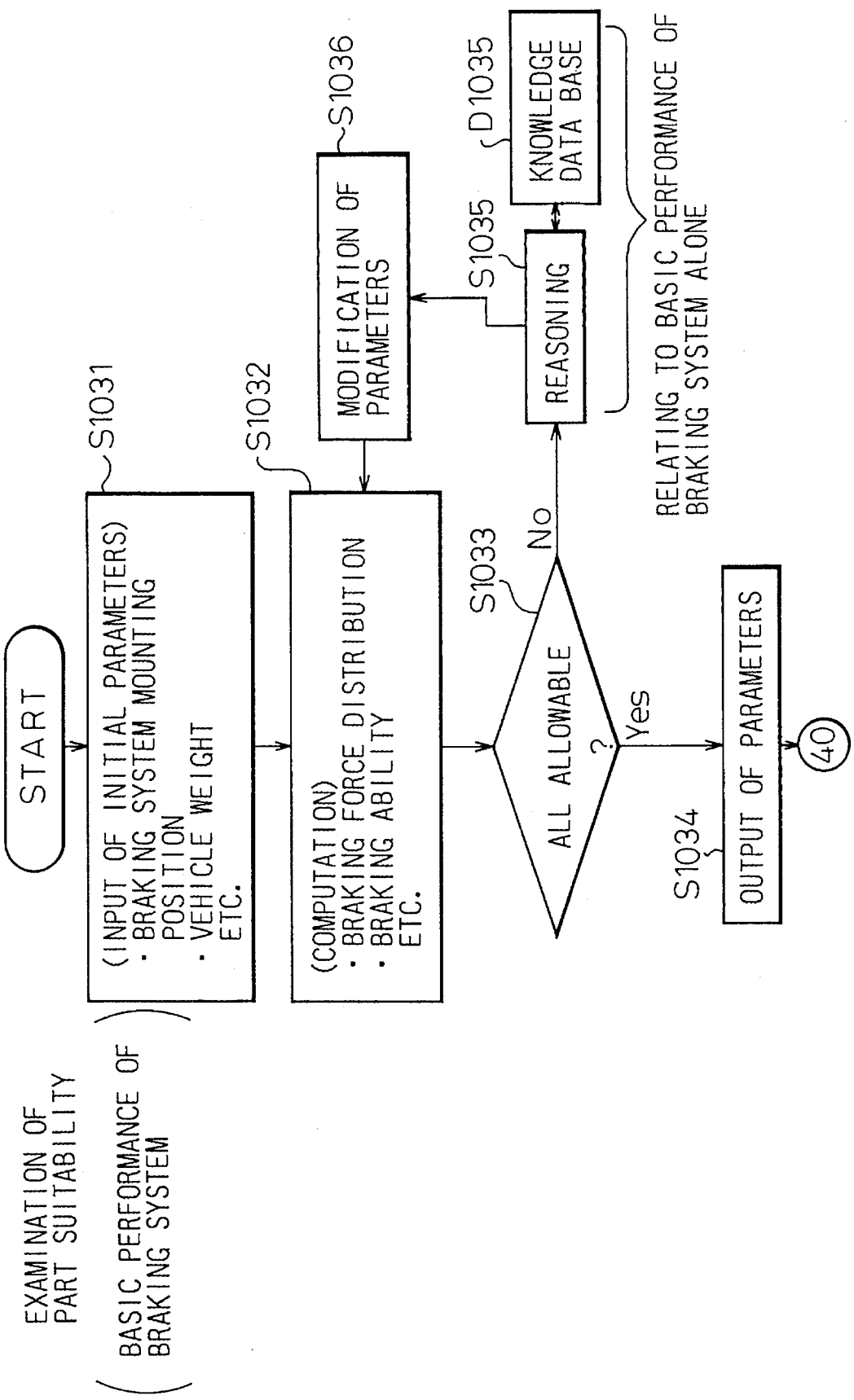
FIG. 7 is a flow chart of a processing operation of a part suitability examination means of the second embodiment of the design assisting apparatus according to the present invention (braking system parts)

In the same way, FIG. 7 is a flow chart of a processing operation of a part suitability examination means of engine braking system parts.

Figure 8:
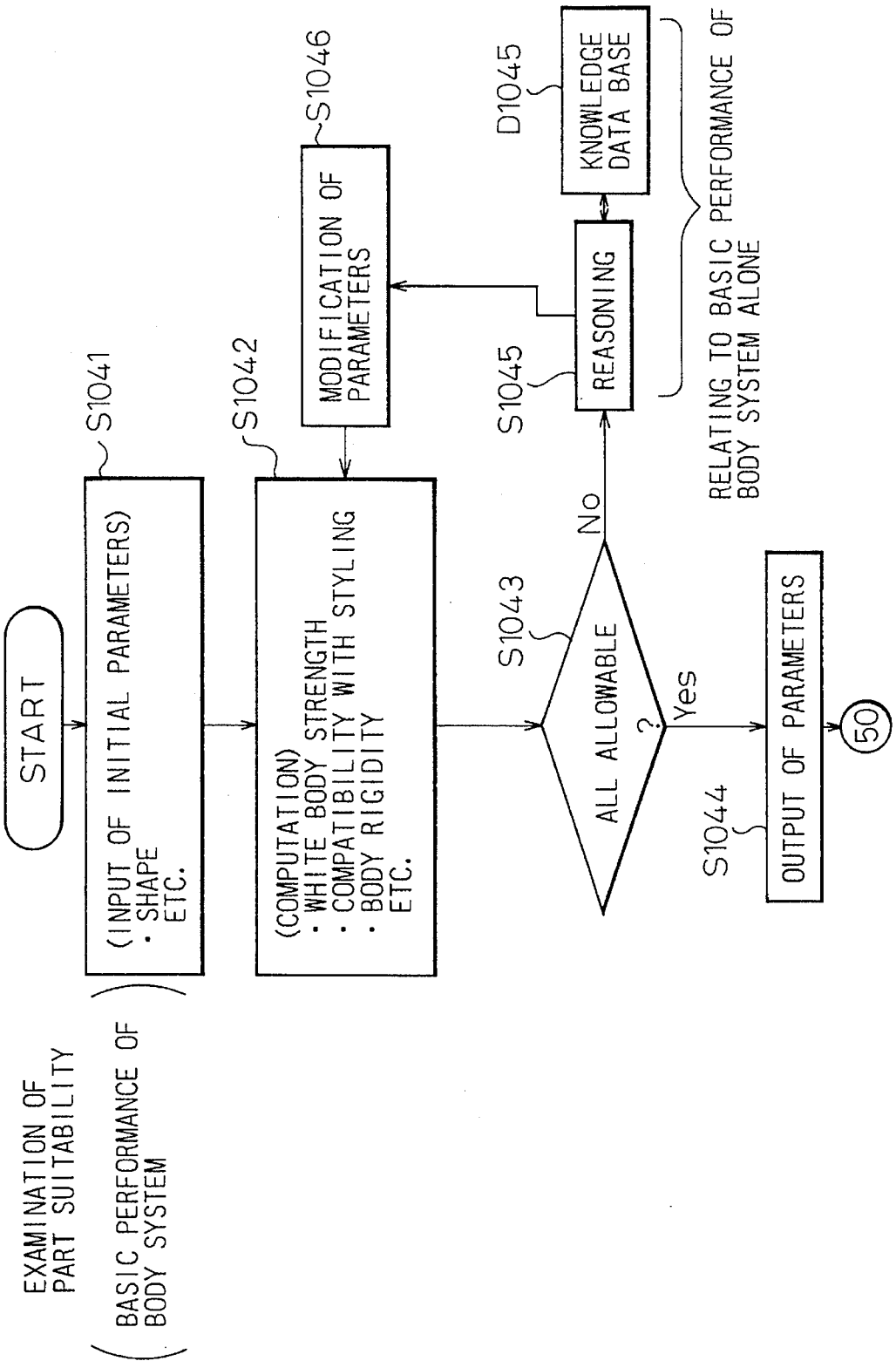
FIG. 8 is a flow chart of a processing operation of a part suitability examination means of the second embodiment of the design assisting apparatus according to the present invention (body parts)

In the same way, FIG. 8 is a flow chart of a processing operation of a part suitability examination means of body parts.

Figure 9:
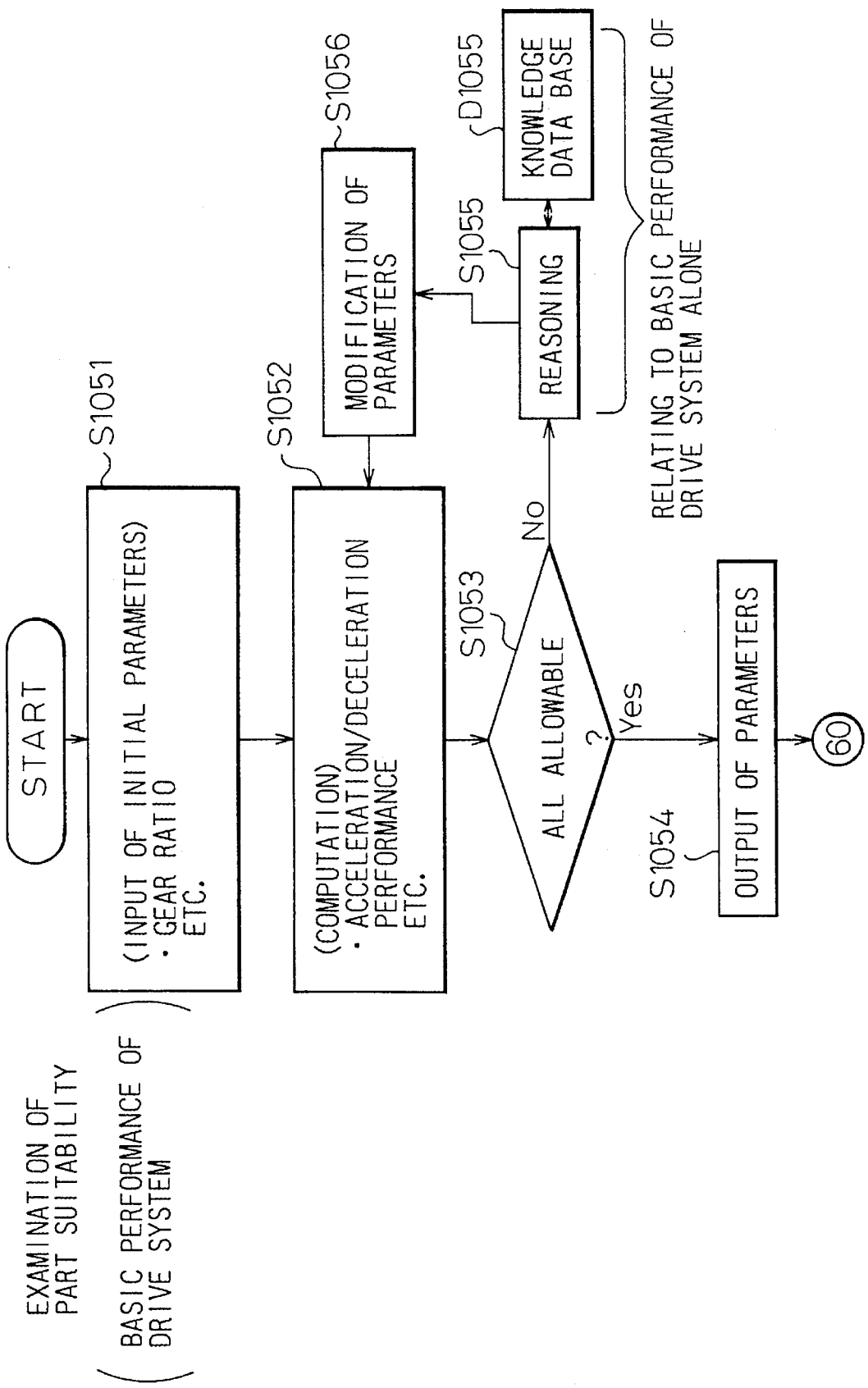
FIG. 9 is a flow chart of a processing operation of a part suitability examination means of the second embodiment of the design assisting apparatus according to the present invention (drive system parts)

In the same way, FIG. 9 is a flow chart of a processing operation of a part suitability examination means of drive system parts.

Figure 10:
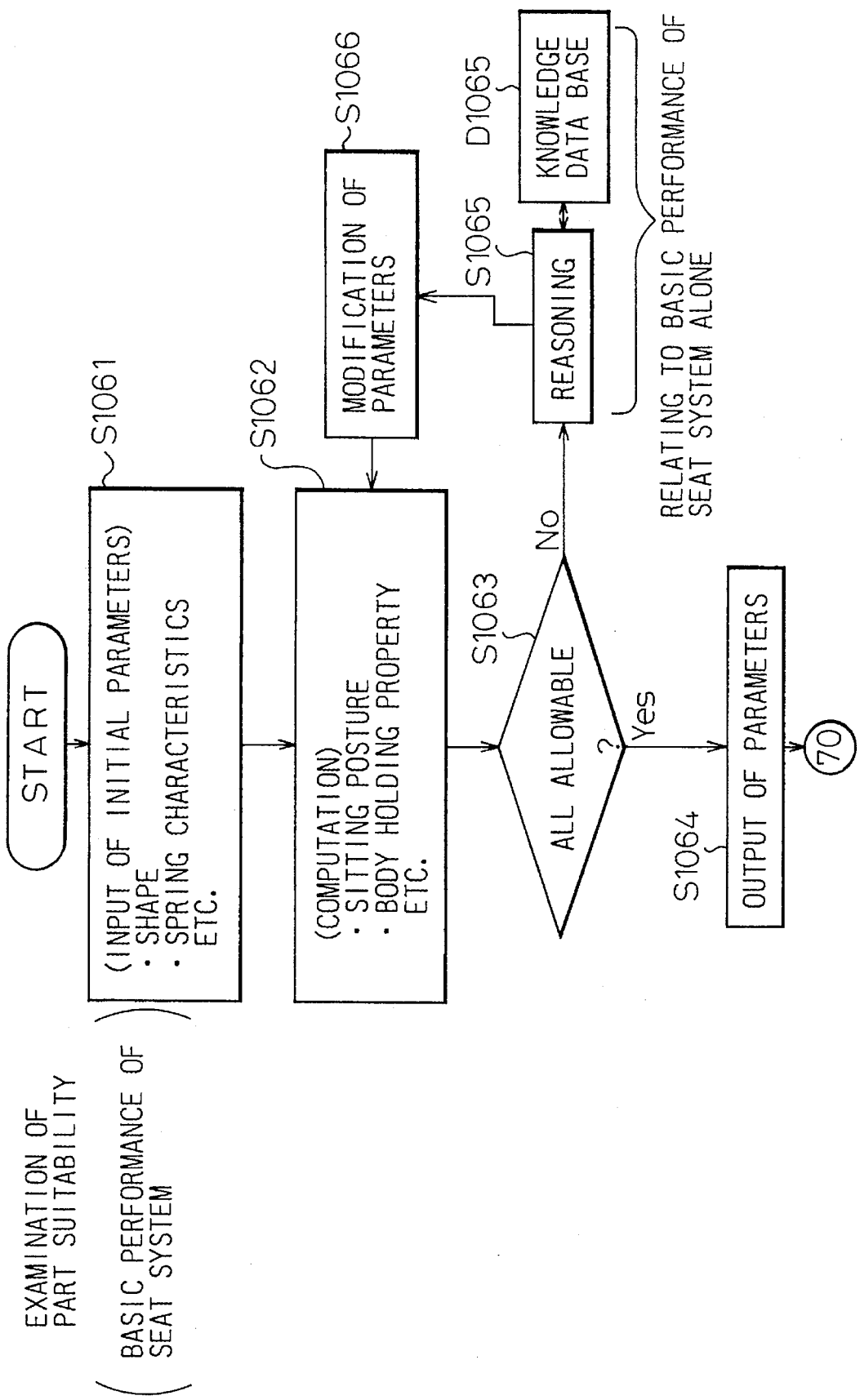
FIG. 10 is a flow chart of a processing operation of a part suitability examination means of the second embodiment of the design assisting apparatus according to the present invention (seat system parts)

In the same way, FIG. 10 is a flow chart of a processing operation of a part suitability examination means of seat system parts.

Figure 11:
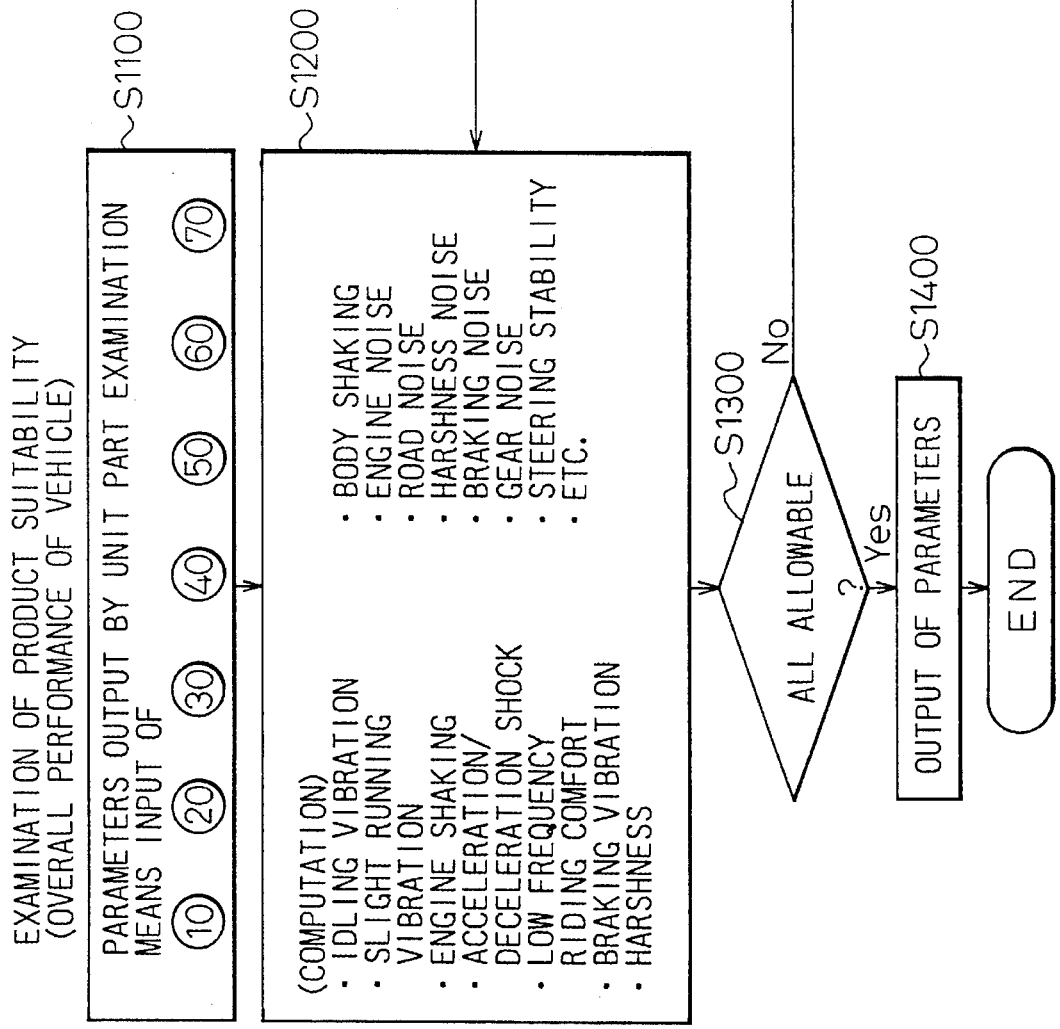
FIG. 11 is a flow chart of a processing operation of a product suitability examination means of the second embodiment of the design assisting apparatus according to the present invention.

FIG. 11 is a flow chart of a processing operation of a product suitability examination means for examining the overall performance of the product, that is, the vehicle, by receiving input of parameters output from the part suitability examination means of the individual parts.

At step 1100, the parameters output from the part suitability examination means of the individual parts are input.

At step 1200, the necessary parameters among the parameters input at step 1100 are used and the overall performances shown by V-1, 2, 3, 4, 5, 6, 7 and 8, N-1, 2, 3, 4, and 5, and C-1 are computed. For example, for the idling vibration of V-1, the engine mounting system parts, the suspension system parts (including tires), the steering system parts, and the body parts are involved, so the parameters shown by 10, 20, 30, and 50 are used.

At step 1300, it is decided if the results of the computation at step 1200 clear the allowable values. If yes, the routine proceeds to step 1400 and is ended, while if no, proceeds to step 1500.

At step 1500, the knowledge stored in the product knowledge data base D1500 is referred to and it is reasoned what to do to make the computation at step 1200 decide that the values clear the allowable values at step 1300. Accordingly, the method for making the magnitude of a certain frequency vertical vibration of the floor of the vehicle clear the allowable value when applying vibration to the ground contact surface of the vehicle is stored in the product knowledge data base D1500.

At step 1600, the parameters are modified based on the results of the reasoning at step 1500, the routine returns to step 1200 where the computation is again performed, then the routine proceeds to step 1300. If it is decided that the parameters clear the allowable values, the routine proceeds to step 1400 where they are output. If it is decided at step 1300 that the parameters again exceed the allowable values, the routine once again proceeds to step 1500. This is repeated until the decision at step 1300 becomes yes.

Figure 12:
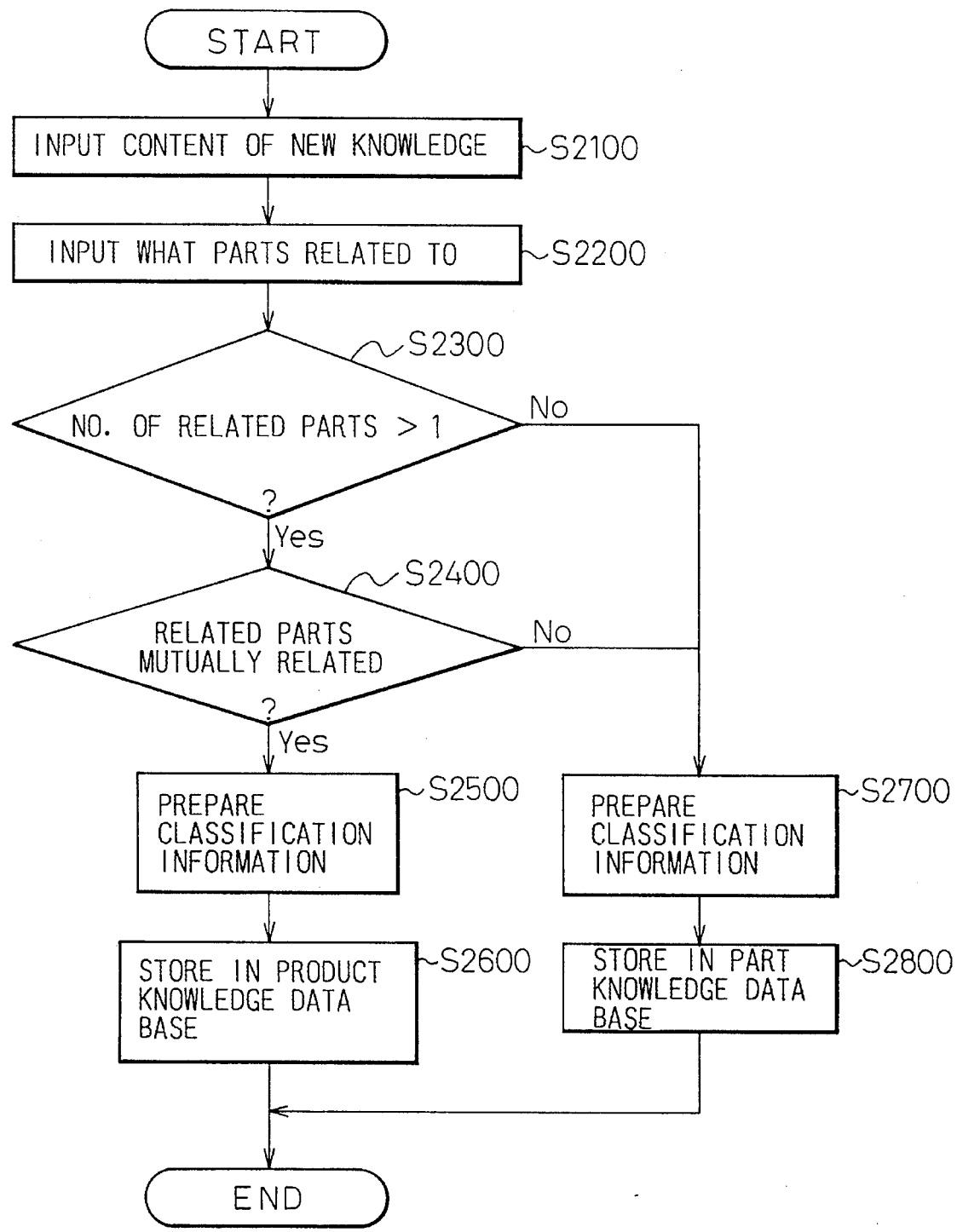
FIG. 12 is a flow chart of a processing operation in the case of adding to a knowledge data base new knowledge in the second embodiment of the design assisting apparatus according to the present invention.

FIG. 12 is a flow chart of the processing operation for Judging, at the time of obtaining new knowledge in the second embodiment, if the knowledge should be stored in a part knowledge data base or should be stored in the product knowledge data base and storing the knowledge in one of the above knowledge data bases in accordance with the results of the decision. The explanation will be made taking the example of an automobile in the same way as above.

At step 2100, the content of the new knowledge is input.

At step 2200, what part the knowledge is related to is input.

At step 2300, it is decided if there is more than one related part. If yes, that is, if there is more than one related part, the routine proceeds to step 2400, while if no, that is, if there is must one related part, the routine proceeds to step 2700.

At step 2400, it is decided if the parts relating to the new knowledge are mutually related. If yes, that is, if they are mutually related, the routine proceeds to step 2500, while if no, that is, if they are not mutually related, the routine proceeds to step 2700.

At step 2500, the classification information is prepared and the routine proceeds to step 2600.

At step 2600, the new knowledge is stored in the product knowledge data base with the classification information prepared at step 2500.

On the other hand, when it is decided as no at step 2300 or step 2400 and the routine proceeds to step 2700, the classification information is prepared at step 2700 and the routine proceeds to step 2800.

At step 2800, the classification information and the new knowledge are stored in the part knowledge data base.

FIG. 13 shows an examination of the classification information prepared at step 2500 or 2700. In this case, the classification is performed using an eight digit number with each digit expressed either as 0 or 1. In the figure, the left end is designated as the 1st digit and the right end as the 8th digit. The figure of the first digit shows if the knowledge relates to an individual part or the knowledge relates to the product as a whole. A FIG. 0 shows knowledge relating to an individual part, while 1 shows knowledge relating to the product as a whole. The 2nd to 8th digits show relation to the engine mounting system parts, suspension system parts, steering system parts, braking system parts, body parts, drive system parts, and seat system parts, respectively. A FIG. 0 expresses no relation with those parts, while 1 indicates relation to those parts.

For example, the knowledge expressed as 11100100 is knowledge relating to the product as a whole, that is, a vehicle, relating to the engine mounting system parts, suspension system parts, and body parts.

In the second embodiment, unlike with the first embodiment, the vertical direction resonance frequency and level and the degree of coupling of the vertical frequency and the rotational frequency are examined not by the part suitability examination means, but by the product suitability examination means.

In this way, by limiting the items of examination at the part suitability examination means to the basic part performances which can be assessed on the level of the individual parts, the items for which parameters should be decided on using a large amount of data are decided on at the product suitability examination means where a large amount of data is assembled, so compared with the first embodiment, there are the advantages that the computation time of the part performance decision means is shortened and the amount of data stored in the part knowledge data bases can be reduced.

Further, by classifying the new knowledge into that related to individual parts and that related to the product as a whole as shown in FIGS. 12 and 13, further classifying the knowledge relating to individual parts into those relating to specific parts, and storing the same in the part knowledge data bases or the product knowledge data base, an increase in the amount of data in just specific knowledge data bases is prevented.

Since the present invention is constituted and operates in this way, the individual part suitability examination means each cover the relatively narrow range of knowledge for their respective parts, so the decision on whether the target performances of a part are satisfied is performed in a short period of time. Further, when the result of the decision is that the target performances are not satisfied, since the part knowledge data base for being referred to by the optimization means for optimization does not have to be that large a knowledge data base, it is possible to prevent the time for searching and reasoning from becoming long.

In particular, according to claim 2 and 4, the target performances of the parts are limited to the basic part performances able to be decided on based on the individual parts, so the time for decision and the time for searching and reasoning are shortened further.

I claim:

1. A design assisting apparatus for assisting in design of parts of a product made of an assembly of the parts, said design assisting apparatus comprising:

a) a plurality of part suitability examination means, each of said part suitability examination means including:

(a1) a part performance decision means for deciding if target performances for said part are satisfied;

(a2) a part knowledge data base for storing part knowledge to enable each of said parts in the assembly of the parts to satisfy the target performances of said part; and (a3) a part optimization means for optimizing parameters of a part by referring to the part knowledge stored in said part knowledge data base so that said part satisfies said target performances for said part, said part optimization means optimizes the parameters when said part does not satisfy the target performances for said part before the optimizing, wherein initially input parameters are first optimized to satisfy the target performances of said parts and then outputted; and b) a said product suitability examination means including:
- (b1) a product performance decision means for deciding if said product satisfies target performances for the product;
- (b2) a product knowledge data base storing product knowledge to enable said product to satisfy said target performances of said product; and
- (b3) a product optimization means for optimizing said parameters of said parts of said assembly of the parts constituting said product by referring to said product knowledge stored in said product knowledge data base so that said product satisfies said target performances for said product, said product optimization means optimizes the parameters when said product does not satisfy said target performances of said product under existing parameters, wherein the parameters of said plurality of parts outputted by said part suitability examination means are first optimized to satisfy said target performances for said product and then outputted.

2. The design assisting apparatus according to claim 1, wherein:

said target performances which each of said part performance decision means use as indicators for their decisions are basic part performances;

said part knowledge stored in the part knowledge data bases is knowledge for enabling each of said parts in the assembly of the parts to satisfy said basic part performances;

said target performances which said product performance decision means uses as indicators for decisions are overall product performances;

said product knowledge stored in said product knowledge data base is knowledge for enabling said product to satisfy said overall product performances of said product;

said part suitability examination means optimizing and outputting the parameters initially input for each of the plurality of parts by referring to said part knowledge stored in said part knowledge data base so as to satisfy said basic part performances of said part when said part does not satisfy said basic part performances of said part under existing parameters; and said product suitability examination means optimizing and outputting said parameters of said parts of the assembly of the parts outputted by said part suitability examination means by referring to said product knowledge stored in said product knowledge data base so as to satisfy said overall product performances of said product in the case where said product does not satisfy said overall product performance of said product under existing parameters.

3. A method for assisting in design of parts of a product made of an assembly of the parts, said method for assisting design comprising:
a) deciding if each of said parts satisfies corresponding target performances of said part;
b) optimizing and outputting initially input parameters of said parts so that each said parts satisfies the corresponding target performances of said part by referring to knowledge for enabling each of said parts to satisfy said target performances of said part stored in a corresponding part knowledge data base for satisfying the target performances of said part when each of said parts does not satisfy the target performances of that part under existing parameters:
c) deciding if the product comprised of the assembly of parts with said parameters optimized to satisfy said target performances of said parts satisfies target performances for said product; and
d) optimizing and outputting said parameters to satisfy the target performances of the parts, so as to satisfy the target performances of the product by referring to knowledge for enabling said product to satisfy said target performances of said product stored in a product knowledge data base for satisfying the target performances of the product to optimize the parameters of the parts of the assembly, in the case where the product does not satisfy the performances of said product under existing parameters.

4. The method for assisting in design of parts of a product made of an assembly of the parts according to claim 3, wherein:

said target performances which are used as indicators for decision of part suitability are basic part performances;

said part knowledge stored in said part knowledge data bases is knowledge for enabling each of said parts in the assembly to satisfy said basic part performances of said parts;

said target performances which are used as indicators for decision of product suitability are overall performances;

said product knowledge stored in said product knowledge data base is knowledge for enabling said product to satisfy said overall performances of said product;

said optimizing and outputting of said initially input parameters of said parameters of said parts are performed by referring to part knowledge stored in corresponding knowledged part data bases so that each of said pans satisfies said basic part performances of said part when said part does not satisfy said basic part performance of said part under existing parameters; and said optimizing and outputting of said parameters optimized to satisfy said basic part performances of said parts are performed by referring to said product knowledge stored in said product knowledge data base so that said product satisfies said overall product performances for said product when said product does not satisfy said overall product performances of said product under existing parameters.

* * * * *